US 6,579,795 B1

(12) United States Patent
Hau-Riege

(10) Patent No.: US 6,579,795 B1
(45) Date of Patent: Jun. 17, 2003

(54) METHOD OF MAKING A SEMICONDUCTOR DEVICE THAT HAS COPPER DAMASCENE INTERCONNECTS WITH ENHANCED ELECTROMIGRATION RELIABILITY

(75) Inventor: Stefan Hau-Riege, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/115,300

(22) Filed: Apr. 2, 2002

(51) Int. Cl.[7] .............................................. H01L 21/44
(52) U.S. Cl. ........................ 438/687; 438/678; 438/672; 438/627; 438/692
(58) Field of Search ................................ 438/687, 672, 438/927, 648, 629, 627, 618, 612, 692, 678, 231, 655, 396, 397, 386

(56) References Cited

U.S. PATENT DOCUMENTS

| 5,527,739 A | * | 6/1996 | Parrillo et al. ............... 438/687 |
| 5,614,764 A | | 3/1997 | Baerg et al. ................. 257/767 |
| 5,654,245 A | * | 8/1997 | Allen ........................... 438/629 |
| 5,904,560 A | | 5/1999 | Brumley ........................ 438/639 |
| 5,909,635 A | | 6/1999 | Marieb et al. ................. 438/625 |
| 5,936,296 A | * | 8/1999 | Park et al. .................... 257/529 |
| 6,110,278 A | * | 8/2000 | Saxena ........................... 117/92 |
| 6,191,029 B1 | | 2/2001 | Hsiao et al. ................. 438/633 |
| 6,400,031 B1 | * | 6/2002 | Harada ......................... 257/776 |

OTHER PUBLICATIONS

N.E. Meier et al, "Electromigration Voiding in Argon–Implanted Interconnects", Mat. Res. Soc. Symp. Proc. vol. 563, 1999 Materials Research Society, pp. 97–102.

* cited by examiner

Primary Examiner—Matthew Smith
Assistant Examiner—Igwe U. Anya
(74) Attorney, Agent, or Firm—Mark V. Seeley

(57) ABSTRACT

A method of making a semiconductor device is described. That method comprises forming a copper containing layer on a substrate, introducing a void nucleation site into the copper containing layer, and forming a via that is located a distance removed from where the void nucleation site was introduced into the copper containing layer.

20 Claims, 2 Drawing Sheets

METHOD OF MAKING A SEMICONDUCTOR DEVICE THAT HAS COPPER DAMASCENE INTERCONNECTS WITH ENHANCED ELECTROMIGRATION RELIABILITY

FIELD OF THE INVENTION

The present invention relates to a method of making semiconductor devices, in particular, devices that include copper damascene interconnects.

BACKGROUND OF THE INVENTION

When making advanced semiconductor devices, copper interconnects may offer a number of advantages over those made from aluminum. For that reason, copper has become the material of choice for making such devices' interconnects. As device dimensions shrink so does conductor width—leading to higher resistance and current density. Increasing current density can increase the rate at which copper atoms are displaced when current passes through a copper conductor. Such electromigration can cause vacancies, which may lead to voids, e.g., at the interface between the copper conductor and a barrier layer that may be formed on the conductor. If a void grows to a size that creates metal separation, e.g., near a via that contacts the conductor, it may cause an open-circuit failure.

One way to prevent electromigration from causing interconnect failure is to limit the amount of current that passes through the conductor. That solution to the electromigration problem is impractical, however, because devices will operate at progressively higher currents, even as they continue to shrink. As an alternative, reliability can be enhanced by doping the interconnect—as adding dopants to the conductor can reduce the rate at which copper diffuses. Doping the interconnect, however, can raise its resistance significantly. To reduce RC delay that is associated with high resistance, it may be necessary to limit dopant concentration—or dispense with doping altogether, e.g., when forming high speed conductors. When low level doping is required to limit conductor resistance, the electromigration mitigating impact that such doping provides is reduced.

Accordingly, there is a need for an improved process for making a semiconductor device that includes copper interconnects. There is a need for such a process that reduces electromigration without significantly raising conductor resistance. The method of the present invention provides such a process.

DETAILED DESCRIPTION OF THE PRESENT INVENTION

A method for making a semiconductor device is described. That method comprises forming a copper containing layer on a substrate, introducing a void nucleation site into the copper containing layer, and forming a via that is located a distance removed from where the void nucleation site was introduced into the copper containing layer. The void nucleation site preferably is introduced into the copper containing layer before a barrier layer is formed on it, and may be generated in various ways—several of which will be described in more detail below. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1:
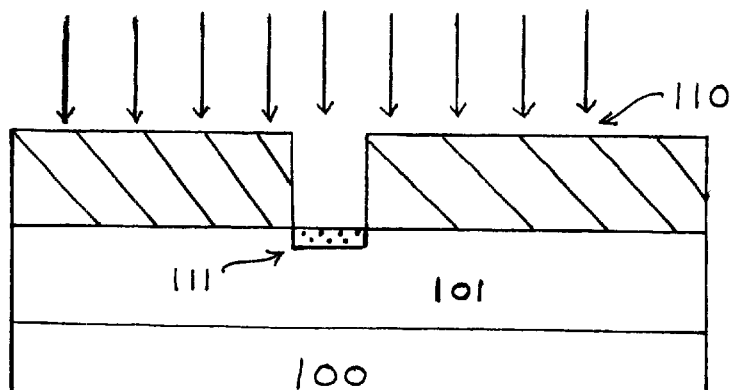
FIG. 1 represents a cross-section of a structure that may result after certain steps are used to make a semiconductor device using a first embodiment of the method of the present invention.

FIGS. 1–5 represent cross-sections of structures that may be formed when making a semiconductor device using the method of the present invention to reduce electromigration in a copper conductor. FIG. 1 represents a structure in which copper containing layer 101 has been formed on substrate 100. That structure may be made using conventional processes (e.g., conventional damascene and dual damascene processes) that are well known to those skilled in the art.

At this stage of the process, copper containing layer 101 may be undoped, or lightly doped with an electromigration retarding amount of an element that will not significantly increase layer 101's resistance. Appropriate dopants that may be used are well known to those skilled in the art. The optimum dopant concentration will depend upon layer 101's dimensions and other characteristics, the type of dopant used, and the function layer 101 will perform.

In this embodiment of the present invention, a photoresist layer may be deposited and patterned to form patterned photoresist layer 110, which masks a first part of copper containing layer 101 and exposes a second part of copper containing layer 101. As an alternative to forming masking layer 110 from photoresist, such a masking layer may be made from silicon nitride or silicon carbide. To form a hard mask from such a material, a relatively thin layer of silicon nitride or silicon carbide may be deposited on layer 101, then etched to expose part of the copper containing layer, using conventional techniques. Void nucleation site 111 will be introduced into layer 101 to induce void formation in that layer at that site. Void nucleation site 111 may be created by any process that promotes void formation—without adversely affecting device performance.

As FIG. 1 illustrates, void nucleation site 111 may be introduced into copper containing layer 101 by implanting ions into the exposed part of that layer. In one embodiment, the ions implanted into layer 101 damage part of that layer, e.g., by altering the crystalline structure of that layer. For example, implanting copper, or another appropriate element, into an exposed portion of layer 101 may cause local metallurgical defects to appear at that location, which may serve as a void nucleation site. Alternatively, the ions implanted into layer 101 may—where implanted—impair that layer's ability to effectively adhere to a subsequently deposited barrier layer. Implanting oxygen ions into part of copper containing layer 101 may, for example, cause a void nucleation site to form at that location, if they prevent that part of that layer from strongly adhering to a barrier layer. Ions may be implanted into the exposed part of copper containing layer 101 using conventional ion implantation equipment and processes. The appropriate dose and energy used to implant ions into layer 101, and the optimum duration of the implant process, will depend upon the component implanted and the result the process-is intended to produce.

Figure 2:
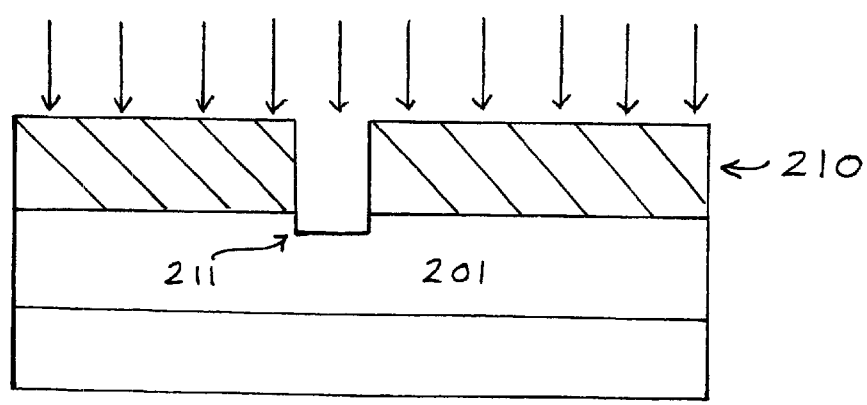
FIG. 2 represents a cross-section of a structure that may result after certain steps are used to make a semiconductor device using a second embodiment of the method of the present invention.

Alternatively, void nucleation site 211 may be introduced into copper containing layer 201 by removing part of that layer using a sputtering process-as illustrated in FIG. 2. In a preferred embodiment, after covering the bulk of layer 201 with mask 210, a conventional sputtering process is used to bombard the exposed part of layer 201 with an inert gas, e.g., argon. This technique may, in itself, create a void that performs an electromigration retardation function. In an embodiment that employs sputtering to introduce such a defect, a void that such a process creates is considered to be a void nucleation site.

Figure 3:
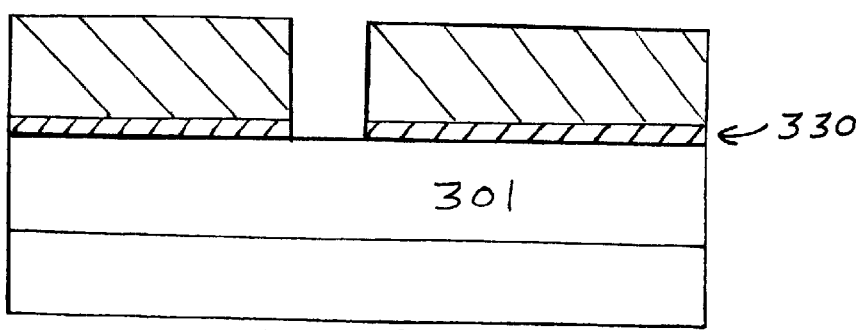
FIG. 3 represents a cross-section of a structure that may result after certain steps are used to make a semiconductor device using a third embodiment of the method of the present invention.

As an alternative to implanting ions, or relying on sputtering, to create the void nucleation site, that site may be introduced into the copper containing layer by excluding part of that layer from process steps that promote adhesion between it and a barrier layer to be formed on the copper containing layer. In the embodiment that FIG. 3 illustrates, shunt layer 330 (e.g., a relatively thin layer formed from tantalum or tantalum nitride) is formed on copper containing layer 301.

After masking shunt layer 330, using either photoresist or a hard mask, the exposed part of that layer is removed to define a void nucleation site. Conventional process steps may be used to form the FIG. 3 structure. In that structure, shunt layer 330 does not cover part of layer 301, while covering the remaining part of layer 301. The part of layer 301 that is not covered by shunt layer 330 constitutes a void nucleation site because of its relatively poor adhesion characteristics.

Figure 4:
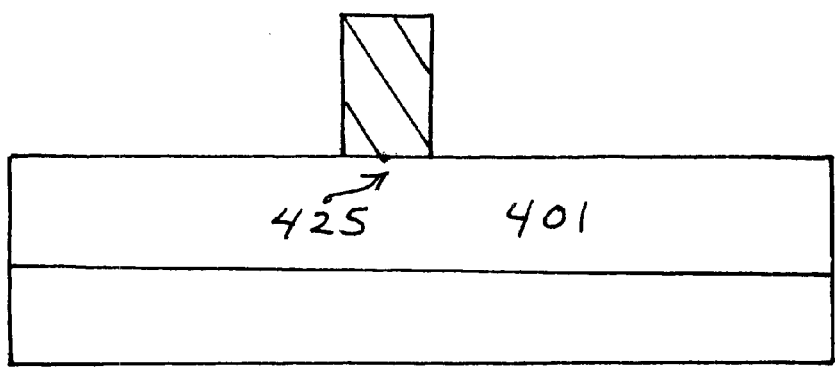
FIG. 4 represents a cross-section of a structure that may result after certain steps are used to make a semiconductor device using a fourth embodiment of the method of the present invention.

FIG. 4 illustrates another way to impart relatively poor adhesion properties to a portion of the copper containing layer. In this embodiment, the part of copper containing layer 401 where the void nucleation site will be formed is masked, while the rest of copper containing layer 401 remains exposed. A cleaning solution (e.g., one typically used to remove undesirable material from a copper layer's surface, after it has been polished and before it is covered with a barrier layer) is then applied to layer 401. Because masked part 425 of layer 401 will have relatively poor adhesion properties, that part of that layer comprises a void nucleation site, where a void may subsequently develop.

Figure 5:
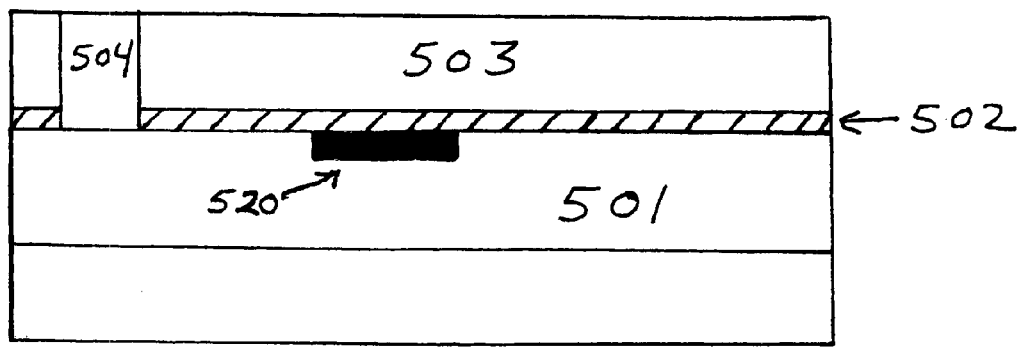
FIG. 5 represents a cross-section of a structure that may result after certain steps are used to make a semiconductor device using an embodiment of the method of the present invention.

After the void nucleation site is introduced into the copper containing layer, a barrier layer 502 may be formed on layer 501, as shown in FIG. 5. (In this embodiment, a shunt layer was not formed, nor was a hard mask retained, prior to forming the barrier layer.) Barrier layer 502 may serve to minimize diffusion from copper containing layer 501 into dielectric layer 503, which will be formed on barrier layer 502. Barrier layer 502 may also act as an etch stop to prevent a subsequent via etch step from exposing copper containing layer 501 to materials used to clean the via.

Barrier layer 502 preferably is made from silicon nitride, silicon oxynitride or silicon carbide, but may be made from other materials. When photoresist is used to mask layer 501 prior to creating a void nucleation site, it must be removed prior to forming the barrier layer. When a hard mask is used to enable creation of a void nucleation site, it may be removed prior to forming barrier layer 502 or instead retained.

Dielectric layer 503 may comprise silicon dioxide, or a material with a lower dielectric constant, e.g., SiOF, carbon doped oxide, or a porous oxide. Other low k materials that may be used to make dielectric layer 503 include organic polymers such as a polyimide, parylene, polyarylether, polynaphthalene, or polyquinoline. In this embodiment of the present invention, via 504 is etched through dielectric layer 503 and part of barrier layer 502 to expose part of copper containing layer 501.

FIG. 5 represents a cross-section of the structure that will result after via 504 is filled with a conductive material, e.g., copper. In a preferred embodiment, via 504 is formed at least about 1 micron away from where the void nucleation site was introduced into copper containing layer 501, and more preferably between about 1 micron and about 5 microns away from that site. Conventional processes may be used to form and etch dielectric layer 503 and to fill via 504, as will be apparent to those skilled in the art. Although many additional steps will be required to complete the device, they will not be described here so as not to obscure the invention.

When the finished device is subject to substantial high current operation, void 520 may form at the void nucleation site. (In some embodiments of the present invention, e.g., those that employ sputtering to remove part of the copper containing layer, void 520 may be present prior to device operation.) When current flows from left to right in the FIG. 5 structure, the presence of void 520 may prevent, or at least reduce, voiding near via 504—presumably because voiding will consistently occur at the void nucleation site (i.e., at the deliberately introduced "weak link" in the conductor) rather than randomly near the via.

Electromigration induced voiding in copper interconnects occurs primarily near the cathode via at the copper/barrier layer interface. The process of the present invention improves interconnect electromigration by deliberately introducing a defect into the copper containing layer, which will induce a void, then forming the via at a distance that is removed from where the defect was created. Intentionally forming a void "downstream" from the via may retard electromigration that may otherwise have occurred "upstream" from that void. This may help prevent an open-circuit failure, which might otherwise have occurred due to void nucleation near the via. Unlike current methods, which rely on relatively substantial doping of the copper line to reduce electromigration, the method of the present invention may serve to reduce electromigration without significantly increasing conductor resistance.

Although the foregoing description has specified certain steps and materials that may be used in the above described method for making a semiconductor device with a copper containing layer that has improved electromigration reliability, those skilled in the art will appreciate that many modifications and substitutions maybe made. It is intended that any such modification, alteration, substitution and/or addition to the specific embodiments described above be considered to fall within the spirit and scope of the invention as defined by the appended claims.

What is claimed is:

1. A method of making a semiconductor device comprising:
   forming a copper containing layer on a substrate;
   introducing a void nucleation site into the copper containing layer; and
   forming a via that is located a distance removed from where the void nucleation site was introduced into the copper containing layer.

2. The method of claim 1 wherein the void nucleation site is introduced into the copper containing layer by excluding part of that layer from process steps that promote adhesion between it and a barrier layer to be formed on the copper containing layer.

3. The method of claim 2 wherein part of the copper containing layer is not covered by a shunt layer, while the remaining part of the copper containing layer is covered by the shunt layer.

4. The method of claim 2 wherein part of the copper containing layer is not exposed to a solution used to clean that layer prior to forming a barrier layer on the copper containing layer, while the remaining part of the copper containing layer is exposed to the solution.

5. The method of claim 1 wherein the void nucleation site is introduced into the copper containing layer by implanting ions into that layer where a void will be generated.

6. The method of claim 5 wherein the ions damage part of the copper containing layer.

7. The method of claim 6 wherein the ions comprise copper ions.

8. The method of claim 5 wherein the ions impair the ability of part of the copper containing layer to adhere to a barrier layer.to be formed on the copper containing layer.

9. The method of claim 8 wherein the ions comprise oxygen ions.

10. The method of claim 1 wherein the void nucleation site is introduced into the copper containing layer by removing part of the layer using a sputtering process.

11. The method of claim 10 wherein the sputtering process bombards part of the copper containing layer with an inert gas.

12. The method of claim 1 wherein, the via is formed at least about 1 micron away from where the void nucleation site was introduced into the copper containing layer.

13. The method of claim 12 wherein the via is formed between about 1 micron and about 5 microns away from where the void nucleation site was introduced into the copper containing layer.

14. A method of making a semiconductor device comprising:

forming a copper containing layer on a substrate;

masking a first part of the copper containing layer;

introducing a void nucleation site into a second part of the copper containing layer;

forming a via that contacts the copper containing layer at a location which is removed from the second part of the copper containing layer; and generating a void in the copper containing layer where the void nucleation site was introduced into the copper containing layer.

15. The method of claim 14 wherein the void nucleation site is introduced into the second part of the copper containing layer by implanting ions into that second part of that layer.

16. The method of claim 14 wherein the void nucleation site is introduced into the second part of the copper containing layer by removing part of that layer using a sputtering process.

17. The method of claim 14 wherein the void nucleation site is introduced into the second part of the copper containing layer by removing the part of a shunt layer that is located on the second part of the copper containing layer.

18. A method of making a semiconductor device comprising:

forming a copper containing layer on a substrate;

introducing a void nucleation site into the copper containing layer;

forming a dielectric layer on the copper containing layer; and etching a via through the dielectric layer such that the via is located a distance removed from where the void nucleation site was introduced into the copper containing layer.

19. The method of claim 18 further comprising forming a barrier layer on the copper containing layer prior to forming the dielectric layer on the copper containing layer, and wherein the void nucleation site is introduced into the copper containing layer by implanting ions into part of the copper containing layer.

20. The method of claim 19 wherein the via is formed between about 1 micron and about 5 microns away from where the void nucleation site was introduced into the copper containing layer.

* * * * *